(12) United States Patent
Rogers

(10) Patent No.: US 10,256,075 B2
(45) Date of Patent: Apr. 9, 2019

(54) GAS SPLITTING BY TIME AVERAGE INJECTION INTO DIFFERENT ZONES BY FAST GAS VALVES

(71) Applicant: Applied Materials, Inc., Santa Clara, CA (US)

(72) Inventor: James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/004,428

(22) Filed: Jan. 22, 2016

(65) Prior Publication Data

US 2017/0213699 A1 Jul. 27, 2017

(51) Int. Cl.
| | |
|---|---|
| H01L 21/306 | (2006.01) |
| H01L 21/3065 | (2006.01) |
| H01L 21/3213 | (2006.01) |
| H01J 37/32 | (2006.01) |
| C23C 16/455 | (2006.01) |
| C23C 16/52 | (2006.01) |

(52) U.S. Cl.
CPC .. *H01J 37/32009* (2013.01); *C23C 16/45563* (2013.01); *C23C 16/52* (2013.01); *H01J 37/3244* (2013.01); *H01J 37/32449* (2013.01); *H01L 21/3065* (2013.01); *H01L 21/30621* (2013.01); *H01L 21/32135* (2013.01); *H01L 21/32136* (2013.01)

(58) Field of Classification Search
None
See application file for complete search history.

(56) References Cited

U.S. PATENT DOCUMENTS

| | | | |
|---|---|---|---|
| 6,734,020 B2 | 5/2004 | Lu et al. | |
| 6,773,507 B2 | 8/2004 | Jallepally et al. | |
| 6,818,094 B2 | 11/2004 | Yudovsky | |
| 6,868,859 B2 | 3/2005 | Yudovsky | |
| 7,431,859 B2 | 10/2008 | Bera et al. | |
| 7,540,971 B2 | 6/2009 | Bera et al. | |
| 7,541,292 B2 | 6/2009 | Bera et al. | |
| 7,708,859 B2 | 5/2010 | Huang et al. | |
| 7,976,671 B2 | 7/2011 | Chandrachood et al. | |
| 8,088,248 B2 | 1/2012 | Larson | |
| 8,187,415 B2 | 5/2012 | Kim et al. | |
| 8,231,799 B2 | 7/2012 | Bera et al. | |
| 8,313,611 B2 | 11/2012 | Larson | |
| 8,673,785 B2 | 3/2014 | Huang et al. | |
| 8,772,171 B2 | 7/2014 | Larson | |
| 2003/0000924 A1* | 1/2003 | Strang | C23C 16/45523 216/86 |

(Continued)

*Primary Examiner* — Stephanie P Duclair
(74) *Attorney, Agent, or Firm* — Patterson + Sheridan, LLP

(57) ABSTRACT

Techniques are disclosed for methods and apparatuses for delivering process gas for processing a substrate. In one embodiment, the method begins by injecting process gas into a processing chamber proximate an edge of a substrate disposed in the processing chamber from a first location. The method then continues by way of injecting the process gas into the processing chamber proximate the edge of the substrate disposed in the processing chamber from a second location while no gas is injected from the first location. Finally, the method finishes by way of processing the substrate in the presence of the processing gas injected from the first and second location.

15 Claims, 3 Drawing Sheets

(56) References Cited

U.S. PATENT DOCUMENTS

| | | | |
|---|---|---|---|
| 2004/0112538 A1* | 6/2004 | Larson | H01L 21/67017 156/345.33 |
| 2009/0221149 A1* | 9/2009 | Hammond, IV | H01J 37/32449 438/706 |
| 2009/0272717 A1 | 11/2009 | Pamarthy et al. | |
| 2013/0000731 A1* | 1/2013 | Singh | H01L 21/67017 137/1 |
| 2014/0261805 A1 | 9/2014 | Nangoy et al. | |
| 2016/0148813 A1* | 5/2016 | Rogers | H01J 37/3244 438/714 |

* cited by examiner

GAS SPLITTING BY TIME AVERAGE INJECTION INTO DIFFERENT ZONES BY FAST GAS VALVES

BACKGROUND

Field

Embodiments described herein generally relate to semiconductor manufacturing and more particularly to a method and apparatus for providing process gases for processing a semiconductor substrate.

Description of the Related Art

During the manufacture of semiconductor devices, a substrate may undergo multiple operations in a variety of processing chambers, or even a single processing chamber, for the purpose of forming material layers and features suitable for an end use. For example, the substrate may undergo several depositions, annealing, and etching operations, among other operations.

Device miniaturization has made small dimensions for device patterns formed in a film layer of the substrate more critical. Achieving the critical dimensions in the substrate begins with a good quality film layer having good adhesion to the underlying film layers in the substrate. Forming vias and other high quality closely packed features in the substrate may require processes utilizing multiple gases during a single operation. For example, the formation of deep vias may require precise control of process gas flows into the processing chamber for etching as well as forming protective polymerization layers for ensuring the deep vias have substantially vertical sidewalls. Maintaining good control for the delivery of the process gases during processing promotes process uniformity in forming the quality device features.

Gas delivery systems used with semiconductor processing chambers generally include either a mass gas flow meter (MFC) as the primary flow regulation device or a system of fast valves for fast gas exchange. Gas delivery systems with fast evacuation paths enable a plurality of processing gases to be supplied from the gas delivery systems into the processing system with a stable gas flow and minimum fluctuation. The fast gas exchange systems use a plurality of orifices, or choke points, to tune the flow paths for controlling the flow of the different process gases. However, the fast gas exchange systems are a complicated system of orifices and valves which take up considerable real estate and are costly to implement and maintain.

Therefore, there is a need for a low cost and effective gas delivery system for controlling the delivery of process gases to a processing system.

SUMMARY

Techniques are disclosed for methods and apparatuses for a gas delivery assembly and for processing a substrate with said gas delivery assembly. In one embodiment, the method begins by injecting process gas into a processing chamber proximate an edge of a substrate disposed in the processing chamber from a first location. The method then continues by way of injecting the process gas into the processing chamber proximate the edge of the substrate disposed in the processing chamber from a second location while no gas is injected from the first location. Finally, the method finishes by way of processing the substrate in the presence of the processing gas injected from the first and second location.

In another embodiment, a processing chamber has a plurality of walls, a bottom, and a lid. The plurality of walls, the bottom and the lid define and interior volume. A substrate support is disposed in the interior volume. The substrate support has a top surface configured to support a substrate thereon. The processing chamber additionally has a gas delivery assembly. The gas delivery assembly has a gas manifold disposed outside the interior volume of the processing chamber. The gas delivery assembly additionally is coupled to two or more gas nozzles positioned to deliver gas into the interior volume from the gas manifold. Gas passageways extend from the gas manifold to the two or more gas nozzles, wherein each gas passageway has substantially the same conductance.

In yet another embodiment, a method is provided for processing a substrate in a processing chamber having a plurality of spaced apart off center nozzles. The method begins by injecting a process gas from a first nozzle into the processing chamber proximate an edge of the substrate disposed in the processing chamber. The method then continues by way of injecting the process gas from a second nozzle into the processing chamber proximate the edge of the substrate disposed in the processing chamber while no gas is injected from the first nozzle. The method continues by way of injecting the process gas from a third nozzle into the processing chamber proximate the edge of the substrate disposed in the processing chamber while no gas is injected from the first nozzle or second nozzle. The method further continues by way of injecting the process gas from a fourth nozzle into the processing chamber proximate the edge of the substrate disposed in the processing chamber while no gas is injected from the first nozzle, second nozzle, or third nozzle. The method repeats by sequencing around the nozzles.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

Figure 1:
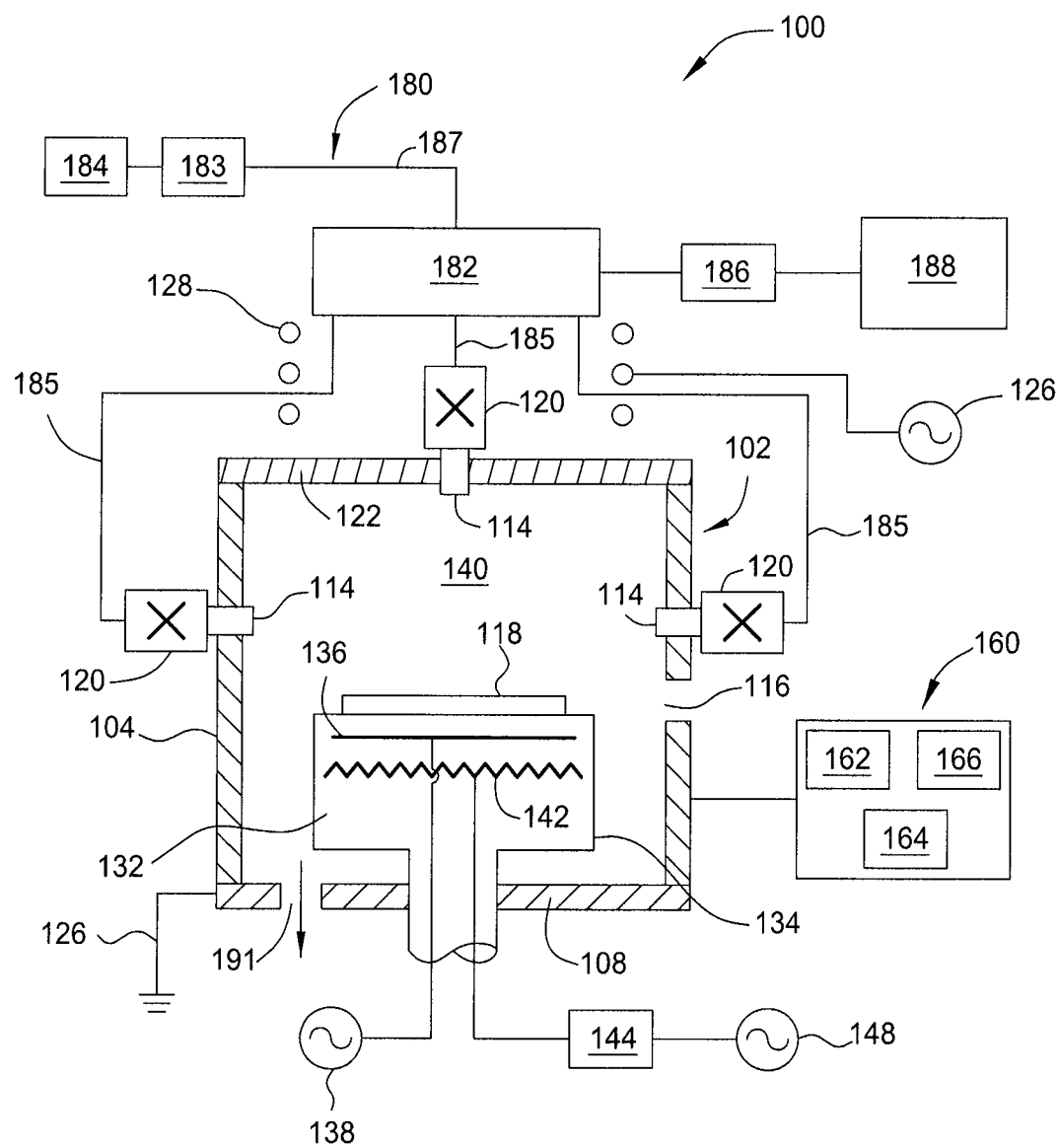
FIG. 1 is a side schematic view of an example process chamber having a gas delivery assembly.

Additional features and advantages will be set forth in the detailed description which follows, and in part will be readily apparent to those skilled in the art from that description or recognized by practicing the embodiments as described herein, including the detailed description that follows, the claims, as well as the appended drawings.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include a gas delivery assembly and a method for using the same. The gas delivery assembly may be deployed in processing chambers using multiple process gases, such as types of processing plasma chambers, for example plasma treatment chambers, physical vapor deposition chambers, chemical vapor deposition chambers, high density plasma chemical vapor deposition (HDPCVD) chambers, low-pressure chemical vapor deposition (LPCVD) chambers, among others, as well as other systems where the ability to control processing uniformity for a features formed in a substrate is desirable. The gas delivery assembly enables quick switching of process gases for better process control at a significant cost reduction compared to conventional flow splitting gas delivery systems.

FIG. 1 is a front schematic view of a processing chamber 100 having a gas delivery assembly 180. The processing chamber 100 shown in FIG. 1 is configured as an etch chamber. However, it should be appreciated that the gas delivery assembly 180 may be utilized in a chemical vapor deposition (CVD) processing chamber, hot wire chemical vapor deposition (HWCVD) processing chamber, physical vapor deposition chamber, or other processing chamber for processing substrates therein. In one embodiment, the processing chamber 100 is a high density plasma chemical vapor deposition (HDPCVD) chamber.

The processing chamber 100 includes a chamber body 102 having a top 122, chamber sidewalls 104 and a chamber bottom 108. The chamber body 102 is coupled to a ground 126. The top 122, the chamber sidewalls 104 and the chamber bottom 108 define an interior volume 140. The chamber sidewalls 104 may include a substrate transfer port 116 to facilitate transferring a substrate 118 into and out of the processing chamber 100. The substrate transfer port 116 may be coupled to a transfer chamber and/or other chambers of a substrate processing system.

A pumping port 191 may be formed in the chamber bottom 108 or the chamber sidewall 104. A pumping device (not shown) is coupled to the pumping port 191 to evacuate and control the pressure within the interior volume 140 of the processing chamber 100. The pumping device may be a conventional roughing pump, roots blower, turbo pump or other similar device that is adapted control the pressure in the interior volume 140.

A pedestal 134 for holding the substrate 118 may be disposed in the interior volume 140. The pedestal 134 may be supported by the chamber sidewall 104 or chamber bottom 108. The pedestal 134 may have cooling fluid channels and other conventional features. The pedestal 134 may include a substrate support 132. The substrate support 132 may be a heater, susceptor, vacuum chuck, electrostatic chuck (ESC) or other suitable structure for supporting or chucking the substrate 118 to the pedestal 134 during processing. The substrate support 132 may include a chucking electrode 136 connected to a chucking power source 138. The substrate support 132 may additionally, or alternately, include a heater electrode 142 connected through a match circuit 144 to a heater power source 148. The substrate support 132 may use electro-static attraction to hold the substrate 118 to the substrate support 132 and apply heat to the substrate 118 during processing in the processing chamber 100.

A top coil 128 and/or a side coil (not shown) may be disposed on the chamber body 102 of the processing chamber 100. The top coil 128 may be connected to one or more RF power sources 126. The top coil 128 induces an electromagnetic field in the interior volume 140 for maintaining a plasma formed from process gasses.

A system controller 160 may operate the processing chamber 100. The system controller 160 includes a central processing unit (CPU) 162, system memory 164, and an input/output interface 166 all in communication via a bus path. CPU 162 may include one or more processing cores. The system memory 164 stores a software applications, and data, for use by CPU 162. Input from one or more user input devices (e.g., sensors, keyboard, mouse, touch screens, still or video cameras, motion sensors, and/or other devices) provided input and instructions to the system controller 160. The system controller 160 controls and coordinates the operations of the processing chamber 100.

The gas delivery assembly 180 provides process and other gases into the interior processing volume 140 of the processing chamber 100. The gas delivery assembly 180 includes a gas panel 184, a gas manifold 182, gas passageways 185, and fast acting valves 120. The gas delivery assembly 180 is coupled to nozzles 114 positioned to deliver gas from the gas delivery assembly 180 into the interior volume 140 of the processing chamber 100. The gas delivery assembly 180 may also include a tuning gas source 188.

The gas panel 184 supplies process and other gases through a gas line 187 to the gas manifold 182. A mass flow controller (MFC) 183 may be disposed on the gas line 187 for regulating the flow of individual gases from the gas panel 184 into the gas manifold 182. The gas panel 184 may be configured to provide one or more process gases, inert gases, non-reactive gases, reactive gases, or cleaning gases if desired. Examples of process gases that may be provided by the gas panel 184 include, but are not limited to, sulfur hexafluoride ($SF_6$), trifluoromethane ($CHF_3$), a silicon (Si) containing gases, carbon precursors and nitrogen containing gases. In one embodiment, the gas panel 184 provides an etchant gas such as sulfur hexafluoride ($SF_6$) into the manifold 182.

Additionally, the tuning gas source 188 may be fluidly coupled to the manifold 182 through a flow controller, such as a mass flow controller (MFC) 186. The tuning gas source 188 may source may provide oxygen ($O_2$), chlorine (Cl2), silane ($SiH_4$), hydrogen (H), or other suitable gas. The MFC 186 regulates the flow of the tuning gas entering into the manifold 182 from the tuning gas source 188. The MFC 186 is configured to operate at a rapid frequency between a flow and non-flow states. For example, the MFC 186 operates to enable the gas flow states to be changed between a flow condition and a non-flow condition at a frequency of between about 0.1 and 0.5 seconds. The rapid switching frequency enables injection of the tuning gas into the manifold 182 to be directed to a single location in the processing chamber, as discussed below with regard to how the flow of gas is sequenced through the nozzles 114.

The manifold 182 is coupled to each of the nozzles 114 by a respective gas passageway 185. The flow through each nozzle 114 is controlled by a fast acting valve 120. Some or all of the nozzles 114 may be equally spaced about the substrate support 132 to promote uniformity of gas flow across the substrate 118. In one embodiment, the processing chamber 100 may have four nozzles 114 disposed about the perimeter of the substrate support 132. In another embodiment, an additional nozzle 114 may be positioned at a central location of the lid 122 and directs gas downward to the center of the substrate support 132.

Figure 2:
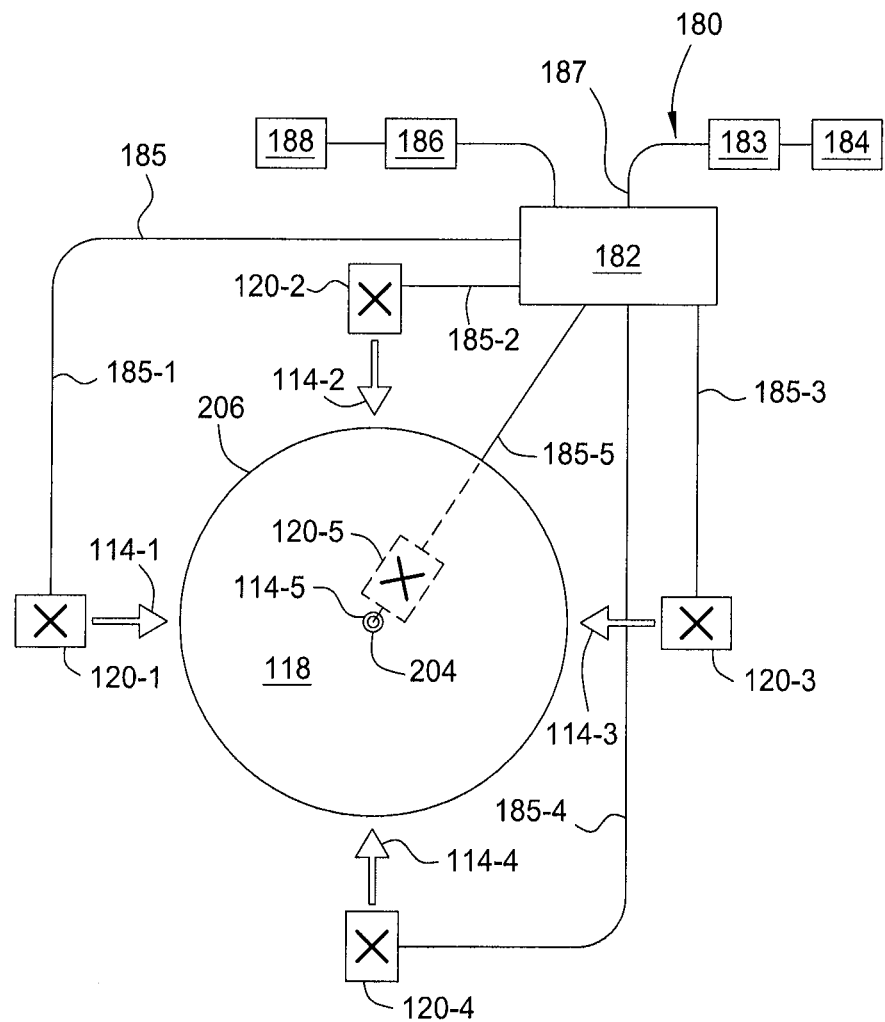
FIG. 2 is a top schematic diagram depicting a substrate disposed in the processing chamber of FIG. 1 interfaced with the gas delivery assembly.

FIG. 2 is a schematic diagram of a substrate disposed in the processing chamber 100 of FIG. 1 interfaced with the gas delivery assembly 180. The gas delivery assembly 180 is shown removed from the processing chamber 100 while depicting the substrate 118 to shown potential configurations for the nozzles 114 are positioned around an outer edge 206 of the substrate 118, and one nozzle 114 positioned over the center of the substrate 118. Although FIG. 2 illustrates 5 nozzles 114, along with corresponding gas passageways 185 and fast acting valves 120, it is contemplated that the processing chamber 100 may have other configurations with two or more nozzles 114.

In one embodiment, a configuration of two nozzles 114 is described. The gas delivery assembly 180 has a first nozzle 114-1 corresponding to a first location and a third nozzle 114-3 corresponding to a second location. The gas manifold 182 is fluidly attached to the first nozzle 114-1 by a first gas passageway 185-1 through a first fast acting valve 120-1. The gas manifold 182 is also fluidly attached to the third nozzle 114-3 by a third gas passageway 185-3 through a third fast acting valve 120-3. The nozzles 114 are adjacent to and may be part of or directly coupled to the fast acting valves 120. Thus, the fast acting valves 120-1, 120-3 are disposed adjacent the walls of the processing chamber. The fast acting valves 120-1, 120-3 are individually controlled and the first fast acting valve 120-1 is closed when the second fast acting valve 120-3 is in an open state. Similarly, the second fast acting valve 120-3 is closed when the first fast acting valve 120-1 is in an open state. The first and third gas passageway 185-1, 185-3 have a substantially similar high conductance. Thus, pressure of the process gas at the first and second fast acting valves 120-1, 120-3 are substantially the same. Additionally, the gas pressure at the nozzles 114-1, 114-3, having their respective first or second fast acting valve 120-1, 120-3 in an open state, is substantially similar to the gas pressure in the first and third gas passageway 185-1, 185-3.

In a second embodiment, a configuration of four nozzles 114 is depicted. The gas delivery assembly 180 has in addition to the first nozzle 114-1 at the first location and a third nozzle 114-3 corresponding now to a third location, a second nozzle 114-2, valve 120-2 and passageway 185-2 corresponding to the second location and a fourth nozzle 114-4, valve 120-4 and passageway 185-4 corresponding to a fourth location. Each gas passageway 185-1, 185-2, 185-3, 185-4 has substantially similar high conductance and is configured to provide a pressure in the gas passageway 185-1, 185-2, 185-3, 185-4 substantially similar to a pressure in the manifold 182 when a gas is flowing through a respective the gas passageway 185-1, 185-2, 185-3, 185-4.

In a third embodiment, a configuration of three nozzles 114 may be similarly described with the nozzles 114 spaced substantially equidistant apart. In a fourth embodiment, a five nozzle 114 configuration may be similarly described similarly to the second embodiment with the addition of a fifth center nozzle 114-5 disposed at a center location 114-5. The gas manifold 182 is fluidly coupled by the fifth gas passageway 185-5 to the fifth center nozzle 114-5 through a fifth fast acting valve 120-5. Thus, it can be plainly seen that any configuration of no The gas delivery assembly 180 may also have one or more mass flow controllers 183, 186 configured to provide a gas into the gas manifold 182. The gas manifold 182 may contain process or other gases sufficient in volume for distribution into the processing chamber during a single cycle for one of the fast acting valves 120. A cycle of one fast acting vale 120 disposed on each of the gas passageways 185, may operate between an open and a closed state in less than 10 milliseconds. The fast acting valves are rated for 10 Million cycles or more and a flow rate of between about 10 SCCM and 5000 SCCM.

The process gas flows through each of the nozzles 114-1, 114-2, 114-3, 114-4, 114-5 one at a time. Thus, when process gas is flowing through the first nozzle 114-1, no process gas is flowing through the second, third, fourth, or fifth nozzle 114-2, 114-3, 114-4, 114-5. The process gas flowing through the nozzle 114 is drawn over the top surface of the substrate 118, or substrate support 132, with the aid of the pressure in the gas passageways 185 and additionally, the vacuum pump. As seen in FIG. 1, the vacuum is drawing from around the bottom of the substrate support 132. The nozzle 114 injects the process gas toward the center 204. The vacuum may draw the process gas across the top of the substrate support 132 past the center 204. In this manner, the gas delivery assembly 180 ensures there is no dead zone present in the center 204 as found in conventional fast gas systems.

The fast acting valves 120 may be configured and sequenced to provide process gases to various zones of the substrate 118 undergoing processing with the supplied process gas. The process may be tuned to increase or decrease the concentration of process gas in a zone of the substrate through timing of the opening and closing of the fast acting valves 120. Furthermore, by averaging the open times for the individual fast acting vales 120, a profile for the concentration of the process gas may be attained and modified during the processing operation. The process gas may be pulsed into each zone individually in a sequence that results in the desired time average split, by cycling the fast acting valves 120. For example, if a 60 percent/40 percent center to edge split is desired, the fast acting valves 120 could continuously repeat 600 milliseconds to the center fast acting valve, i.e. fast acting valve 120-5, then 400 millisecond to the edge valves, i.e. fast acting valve 120-1-120-4, during the process step. If the time for gas to come to equilibrium in the chamber is about 1 second, it is easy to imagine this is similar to a continuous split in the flow along each of the respective gas passageways 185. Even if the equilibration time is much shorter, as long as an integral number of pulse sequence periods are completed during the step, the desired uniformity control may be obtained. Additionally, with the substantially similar high conductance for each of the gas passageways 185, the time to remove one gas and introduce a new gas can be greatly shortened.

Figure 3:
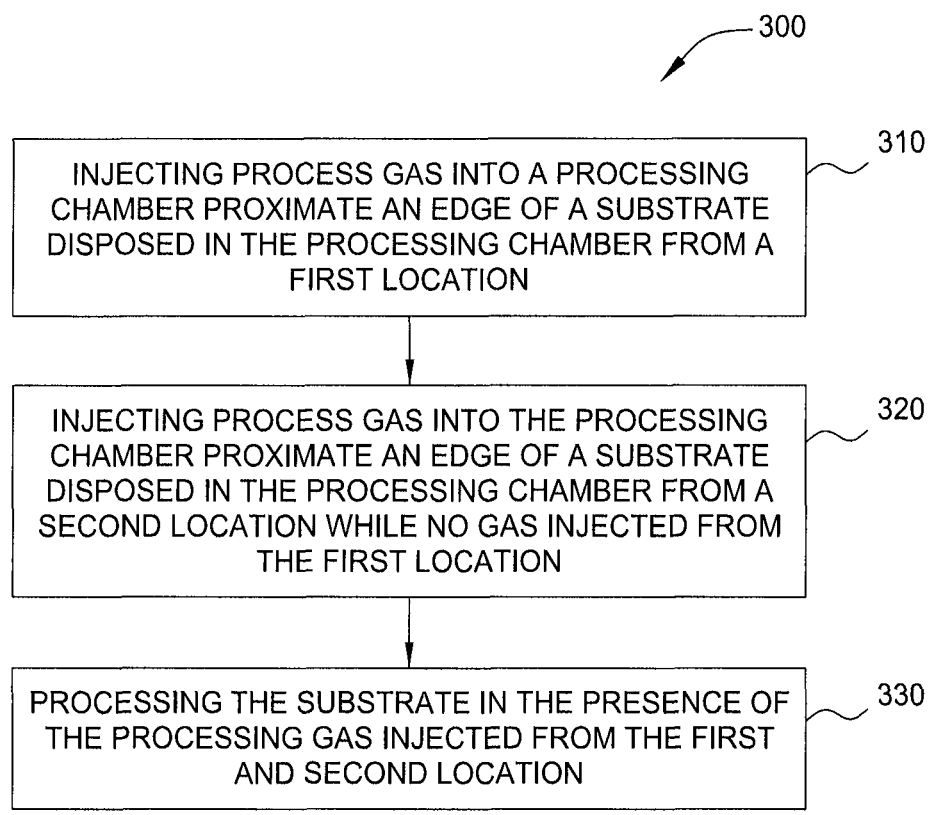
FIG. 3 is a block diagram for a method for processing a substrate.

The operation of the gas delivery assembly 180 is further described with reference to FIG. 3. FIG. 3 is a block diagram for a method 300 for processing a substrate. The processing gasses may perform various processes on the substrate. In a first embodiment, the process gas etches the substrate.

Method 300 begins at block 310 by injecting process gas into a processing chamber proximate an edge of a substrate disposed in the processing chamber through the first nozzle position at a first location. The injection of the process gas is performed by the nozzle having its associated fast acting valve in an open position. The nozzle may be oriented to inject the process gas in a direction radially inward toward the top surface of the substrate similar to the first nozzle in FIG. 2. Alternately, or in addition, the nozzle may be positioned to inject the process gas downward toward the top surface of the substrate similar to the fifth nozzle in FIG. 2. In one embodiment, the nozzles disposed near the edge of the substrate are configured to inject process gas in a direction substantially parallel to the substrate. The gas passageways may have high conductance to prevent choking of the process gas flow. Each gas passageway has a substantially similar conductance. Thus, choke points or orifices are not needed and not a part of the gas delivery assembly. The timing that the valve is open to allow flow through the nozzle controls the amount of gas provided to an area of the substrate exposed to the process gas from the first location. In one embodiment, the process gas injected from the first location may flows across the center portion of the substrate. While the gas is flowing from the first location, no other gas flows from other locations.

Method 300 continues at block 320 by injecting the process gas into the processing chamber proximate the edge of the substrate disposed in the processing chamber from a second location while no gas is injected from the first location or other nozzle locations. The process gas injected from the second location may flow beyond a center portion of the substrate. Thus, the process gas injected from the second location may overlap the extent of the substrate which was previously flowed by the injection of process gas from the first location.

At block 330, the substrate is processed in the presence of the processing gas injected from the first and second location. The processing of the substrate may be accomplished by averaging the times for the separate injections of the process gas from the first location and the second location for determining a concentration of the processes gas across areas, or zones, of the substrate for processing the substrate.

The method 300 may include additional operations. For example, the process gas may be injected by a third nozzle into the processing chamber proximate the edge of the substrate from a third location while gas is not injected from the first location, the second location, or other location. Additionally, the process gas may be injected into the processing chamber proximate the edge of the substrate disposed in the processing chamber from a forth location while no gas is injected from the first, second, third, or other location. The flow of the process gas through each of the nozzles may be substantially the same, e.g. the first and second nozzles, and third and fourth nozzles in such configurations, are substantially the same. Thus, the concentrations for the process gas can be tuned by cycling the injection of the process gas from one or more locations. The concentration of process gas in different zones of the substrate may be determined by the average time for injecting the process gas from each of the nozzles.

Additionally, the process gas may be injected through the fifth nozzle into the processing chamber proximate a center of the substrate disposed in the processing chamber from a fifth location while no additional gas is injected from the locations along the edge. In yet other embodiments, the processing chamber may have more than three nozzles and the center injection is performed while no process gas is injected into the processing chamber from any nozzle other than the center nozzle. The center injection, or fifth nozzle shown in FIG. 2, may be equidistant from the first nozzle, second nozzle, or third nozzle the fourth nozzle. The center zone relative to other zones may be exposed to more or less process gas for attaining azimuthal control, or center to edge control, where the concentration of the process gas at all the edges are equal.

A tuning gas may be provided to any one of the locations from a tuning gas source coupled through a mass flow controller (MFC). The mass flow controller may have a cycle time similar to the fast acting valve at the location of the intended injection of the tuning gas. The tuning gas may be provided to the gas manifold by the MFC in a quantity similar to that which would flow through the timed opening of the fast acting valve for the nozzle at the intended location for the tuning gas. The tuning gas may be supplied to the intended location with or without additional process gas in the manifold.

In addition to averaging the time for injecting from the locations proximate the edge of the substrate the nozzles at the respective locations may be sequenced. In one embodiment, injecting the processing gas from each of the nozzles may proceed in a sequential repetitive pattern. In another embodiment, injecting the processing gas from each of the nozzles may proceed in a clockwise or counter-clockwise pattern. Alternately, the sequence for injecting the process gas may be patterned to achieve a processing effect, such as uniformity of etch. The injection sequence for the nozzles may be timed to extend the processing gas injected from each of the nozzles, disposed proximate the edge of the substrate, past a center of the substrate. The total time in which the process gas is injected from all of the nozzles may be performed in less than about 1 second.

Advantageously, the gas delivery assembly simplifies gas injection to the processing chamber. The gas delivery assembly reduces the real-estate for the gas system and the overall cost of the gas system. Additionally, the gas delivery assembly advantageously is tunable to extend into the center portion of the substrate to prevent dead zones for the processing gas. Thus, better uniformity for the substrate is achieved at a lower cost, While the foregoing is directed to embodiments of the present invention, other and further embodiments of the invention may be devised without departing from the basic scope thereof, and the scope thereof is determined by the claims that follow.

What is claimed is:

1. A method for processing a substrate comprising:
   flowing a first gas out from a gas panel through a mass flow controller into a manifold;
   injecting the first gas from the manifold through a first nozzle in a first direction substantially parallel to a substrate toward a center of a processing chamber from proximate an edge of the substrate disposed in the processing chamber;
   timing the mass flow controller to coincide with the injecting of the first gas to determine when to flow a second gas out from the gas panel through the mass flow controller into the manifold while injecting the first gas;
   injecting the second gas from the manifold through a second nozzle in a second direction substantially parallel to the substrate toward the center of the processing chamber from proximate the edge of the substrate disposed in the processing chamber while the first gas is not injected from the first location;
   controlling a time average for injections of the first gas from the first nozzle and the second gas from the second nozzle to control a concentration of the first and second gases across the substrate; and
   processing the substrate in the presence of the first and second gases injected from the first and second nozzles.

2. The method of claim 1 further comprising:
   injecting a third gas into the processing chamber proximate a center of the substrate disposed in the processing chamber from a third location coupled to the manifold while neither the first gas nor the second gas is injected from the first location or the second location.

3. The method of claim 2 further comprising:
providing a greater amount of a tuning gas from the manifold to the first location than the tuning gas provided from the manifold to the second location.

4. The method of claim 3, wherein the amount of the tuning gas provided to the center is different than the amount of the tuning gas provided at the edge of the substrate.

5. The method of claim 1 further comprising:
averaging the times for the separate injections of the first gas from the first location and the second gas from the second location, wherein the average time for the injection from the first location is greater than the second location.

6. The method of claim 1 further comprising:
injecting a third gas into the processing chamber proximate the edge of the substrate disposed in the processing chamber from a third location while neither the first gas nor the second gas is injected from the first location or the second location; and
injecting the third gas into the processing chamber proximate the edge of the substrate disposed in the processing chamber from a fourth location while neither the first gas, the second gas nor the third gas is injected from the first, second or third location.

7. The method of claim 1, wherein the processing the substrate comprises:
etching the substrate.

8. The method of claim 1, wherein the first gas injected from the first location is the same as the second gas injected from the second location and creates an azimuthal distribution of the first and second gases across the substrate.

9. A method for processing a substrate in a processing chamber having a plurality of spaced apart off center nozzles, the method comprising:
flowing a first process gas out from a gas panel through a mass flow controller into a gas manifold for a first quantity similar to that would flow through a first nozzle;
a) injecting the first process gas from the gas manifold through the first nozzle into the processing chamber proximate an edge of the substrate and substantially parallel to the substrate toward a center of the processing chamber;
a1) timing the mass flow controller to coincide with the injecting of the first process gas to determine when to flow a second quantity of a second process gas out from the gas panel through the mass flow controller into the gas manifold while injecting the first process gas;
flowing the second quantity of the second process gas out from the gas panel through the mass flow controller into the gas manifold while injecting the first process gas, wherein the first process gas and second process gas are different;
b) injecting the second quantity of the second process gas from the gas manifold through a second nozzle into the processing chamber proximate the edge of the substrate and substantially parallel to the substrate toward a center of the processing chamber while the first process gas is not injected from the first nozzle;
flowing a third quantity of a third process gas out from the gas panel through the mass flow controller into the gas manifold while injecting the second process gas;
c) injecting the third quantity of the third process gas from the gas manifold through a third nozzle into the processing chamber proximate the edge of the substrate and substantially parallel to the substrate toward a center of the processing chamber while neither the first gas nor the second gas is injected from the first nozzle or second nozzle;
flowing a fourth quantity of a fourth process gas out from the gas panel through the mass flow controller into the gas manifold while injecting the third process gas;
d) injecting the fourth quantity of the fourth process gas from the gas manifold through a fourth nozzle into the processing chamber proximate the edge of the substrate and substantially parallel to the substrate toward a center of the processing chamber while neither the first process gas, the second process gas nor the third process gas is injected from the first nozzle, second nozzle, or third nozzle; and
sequentially repeating a, b, c and d to control a concentration of the first through fourth process gases across the substrate by time averaging each of a, b, c and d wherein each of a, b, c and d have a substantially similar conductance for the process gas.

10. The method of claim 9 further comprising:
injecting a fifth process gas into the processing chamber proximate a center of the substrate from the manifold through a fifth nozzle equidistant from the first nozzle, the second nozzle, the third nozzle, and the fourth nozzle, while neither the first process gas, the second process gas, the third process gas, nor the fourth process gas is injected from the first nozzle, the second nozzle, the third nozzle, and the fourth nozzle.

11. The method of claim 9, wherein sequencing comprises:
injecting the first process gas, second process gas, third process gas and fourth process gas from each of the respective first nozzle, second nozzle, third nozzle, and fourth nozzle in a clockwise pattern or in a counter clockwise direction.

12. The method of claim 9 further comprising
timing the injection sequence for the first through fourth nozzles to extend the first process gas, second process gas, third process gas and fourth process gas injected from each of the respective first nozzle, second nozzle, third nozzle, and fourth nozzle, disposed proximate the edge of the substrate, past a center of the substrate.

13. The method of claim 12, wherein the sequencing of injecting the first process gas, second process gas, third process gas and fourth process gas from each of the first, second, third and fourth nozzle is performed in less than about 1 second.

14. The method of claim 12, wherein a flow of the first process gas, second process gas, third process gas and fourth process gas through each of the first, second, third and fourth nozzle is substantially the same.

15. The method of claim 9, further comprising
determining a split of process gas flow in the processing chamber by averaging the time for injecting the first process gas, second process gas, third process gas and fourth process gas from each of the first nozzle, second nozzle, third nozzle, and fourth nozzle.

* * * * *